US012724096B2

(12) United States Patent
Sarikhani

(10) Patent No.: US 12,724,096 B2
(45) Date of Patent: Sep. 1, 2026

(54) MAGNETIC COMPENSATION CIRCUIT FOR LINEAR HALL SENSORS

(71) Applicant: CIRCOR AEROSPACE, INC., Hauppauge, NY (US)

(72) Inventor: Ali Sarikhani, Mission Viejo, CA (US)

(73) Assignee: CIRCOR AEROSPACE, INC., Hauppauge, NY (US)

( * ) Notice: Subject to any disclaimer, the term of this patent is extended or adjusted under 35 U.S.C. 154(b) by 211 days.

(21) Appl. No.: 18/653,255

(22) Filed: May 2, 2024

(65) Prior Publication Data

US 2025/0341597 A1 Nov. 6, 2025

(51) Int. Cl.

*G01R 33/38* (2006.01)
*G01R 33/00* (2006.01)
*G01R 33/07* (2006.01)
*G01R 33/3873* (2006.01)
*H02K 11/215* (2016.01)

(52) U.S. Cl.

CPC ..... *G01R 33/3873* (2013.01); *G01R 33/0005* (2013.01); *G01R 33/0035* (2013.01); *G01R 33/072* (2013.01); *H02K 11/215* (2016.01)

(58) Field of Classification Search

CPC ............ G01R 33/3873; G01R 33/0005; G01R 33/0035; G01R 33/072; H02K 11/215; H02K 29/08; G01D 2205/40; G01D 5/145

See application file for complete search history.

(56) References Cited

U.S. PATENT DOCUMENTS 3,407,490 A * 10/1968 Gibbs .................... H02K 15/28 29/606
5,021,735 A * 6/1991 Maass ....................... G01P 3/46 318/640

(Continued)

FOREIGN PATENT DOCUMENTS

DE 102004056303 A1 6/2006
DE 202015102722 U1 8/2016

(Continued)

OTHER PUBLICATIONS

International Search Report and Written Opinion for International Application No. PCT/US2025/027014, filing date Apr. 30, 2025, 17 pages.

*Primary Examiner* — Giovanni Astacio-Oquendo
(74) *Attorney, Agent, or Firm* — KDW FIRM PLLC

(57) ABSTRACT

A motor assembly. The assembly includes a ferromagnetic enclosure having an inner surface, an outer surface, and a body disposed between the inner and outer surfaces. The body includes a first portion having a first predetermined thickness and a second portion having a second predetermined thickness. The enclosure includes first and second notches in the outer surface. The first notch is positioned in the first portion of the body. The second notch is positioned in the second portion of the body. A position of the first notch is configured to be aligned with a position of a first magnetic sensor of a motor. A position of the second notch is configured to aligned with a position of a second magnetic sensor of the motor. The ferromagnetic enclosure is configured to compensate a magnetic field detected by at least one of the first magnetic sensor and the second magnetic sensor.

19 Claims, 4 Drawing Sheets

(56) References Cited

U.S. PATENT DOCUMENTS

| | | | | |
|---|---|---|---|---|
| 6,431,474 | B2 * | 8/2002 | Fochtman | F02M 51/0671 239/585.4 |
| 8,333,259 | B2 * | 12/2012 | Matsuda | H02K 29/08 180/443 |
| 8,847,580 | B1 * | 9/2014 | Osterweil | G01R 33/0076 324/207.13 |
| 11,169,223 | B2 * | 11/2021 | Ostermann | G01R 33/07 |
| 2008/0272765 | A1 * | 11/2008 | Song | G01P 3/48 310/68 B |
| 2009/0251308 | A1 * | 10/2009 | Schweitzer, III | G01R 31/50 324/133 |
| 2015/0233735 | A1 * | 8/2015 | Lerchenmueller | G01D 5/20 324/207.15 |
| 2022/0308132 | A1 * | 9/2022 | Schmitt | G01R 33/072 |
| 2022/0412775 | A1 * | 12/2022 | Eom | G01R 33/0035 |
| 2023/0257888 | A1 * | 8/2023 | Sørensen | C25B 1/04 205/628 |

FOREIGN PATENT DOCUMENTS

| | | | |
|---|---|---|---|
| DE | 102016114003 | A1 | 2/2018 |
| DE | 102007039050 | B4 | 8/2023 |
| EP | 1670121 | A1 | 6/2006 |
| WO | 2009015496 | A1 | 2/2009 |

* cited by examiner

MAGNETIC COMPENSATION CIRCUIT FOR LINEAR HALL SENSORS

BACKGROUND

Brushless direct current (DC) motors are used in a variety of applications and industries. For example, they are routinely found in transport applications (e.g., electric and hybrid vehicles, electric bicycles, etc.), industrial engineering applications (e.g., motion control, linear actuators, servomotors, etc.), aircraft applications, cordless tools, heating, ventilation, and air-conditioning (HVAC) systems, computing systems, and many others. The motors are synchronous motors that use direct current as a source of power and an electric controller to switch DC currents to the motor's windings that generate magnetic fields causing rotation of the rotor equipped with permanent magnets. However, existing brushless DC motor systems do not provide for accurately determining positions of permanent magnets during operation of the motor.

SUMMARY

The following summary is provided to introduce a selection of concepts in a simplified form that are further described below in the detailed description. This summary is not intended to identify key or essential features of the claimed subject matter, nor is it intended as an aid in determining the scope of the claimed subject matter.

In some implementations, the current subject matter relates to a ferromagnetic compensation apparatus. The apparatus may include a ferromagnetic enclosure having an inner surface, an outer surface, and a body disposed between the inner surface and the outer surface. The body may include a first portion having a first predetermined thickness and a second portion having a second predetermined thickness. The enclosure may include a first notch in the outer surface, where the first notch may be positioned in the first portion of the body, and a second notch in the outer surface, where the second notch may be positioned in the second portion of the body. A position of the first notch may be configured to be aligned with a position of a first magnetic sensor of a motor. A position of the second notch may be configured to aligned with a position of a second magnetic sensor of the motor. The ferromagnetic enclosure may be configured to compensate a magnetic field detected by at least one of the first magnetic sensor and the second magnetic sensor.

In some implementations, the current subject matter may include one or more of the following optional features. The ferromagnetic enclosure may be at least one of: a partially circular ferromagnetic enclosure, a partially polygonal ferromagnetic enclosure, a fully circular ferromagnetic enclosure, a fully polygonal ferromagnetic enclosure, and any combination thereof.

In some implementations, the first portion may have a first radial distance defined by a first arc angle value and the second portion may have a second radial distance defined by a second arc angle value.

In some implementations, the first predetermined thickness of the first portion may be defined by a first difference between an outer radius and a first inner radius, where the outer radius may define a distance between a radial center of the body and the outer surface, and the first inner radius defining a distance between the radial center of the body and the inner surface of the first portion. The second predetermined thickness of the second portion may be defined by a second difference between the outer radius and a second inner radius. The second inner radius may define a distance between the radial center of the body and the inner surface of the second portion.

In some implementations, the first inner radius may be less than the second inner radius, and the first predetermined thickness may be greater than the second predetermined thickness.

In some implementations, the body may have a predetermined magnetic permeability.

In some implementations, the predetermined magnetic permeability may be greater than one.

In some implementations, at least one of the first and second magnetic sensors may be a linear Hall sensor.

In some implementations, the motor may be a brushless direct current motor.

In some implementations, the ferromagnetic enclosure may be configured to be positioned adjacent to a stator of the motor.

In some implementations, the current subject matter relates to a motor assembly. The motor assembly may include one or more magnets positioned about a rotor, a stator enclosing one or more magnets, a first and a second magnetic sensors positioned in at least one of the stator and the rotor, and a ferromagnetic enclosure enclosing at least a portion of the stator and having an inner surface, an outer surface, a body disposed between the inner surface and the outer surface, where the body may include a first portion having a first predetermined thickness and a second portion having a second predetermined thickness, a first notch in the outer surface, the first notch may be positioned in the first portion of the body, and a second notch in the outer surface, where the second notch may be positioned in the second portion of the body. A position of the first notch may be configured to be aligned with a position of the first magnetic sensor. A position of the second notch may be configured to aligned with a position of the second magnetic sensor. The ferromagnetic enclosure may be configured to compensate a magnetic field detected by at least one of the first magnetic sensor and the second magnetic sensor.

In some implementations, the current subject matter may include one or more of the following optional features discussed herein.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

Figure 1:
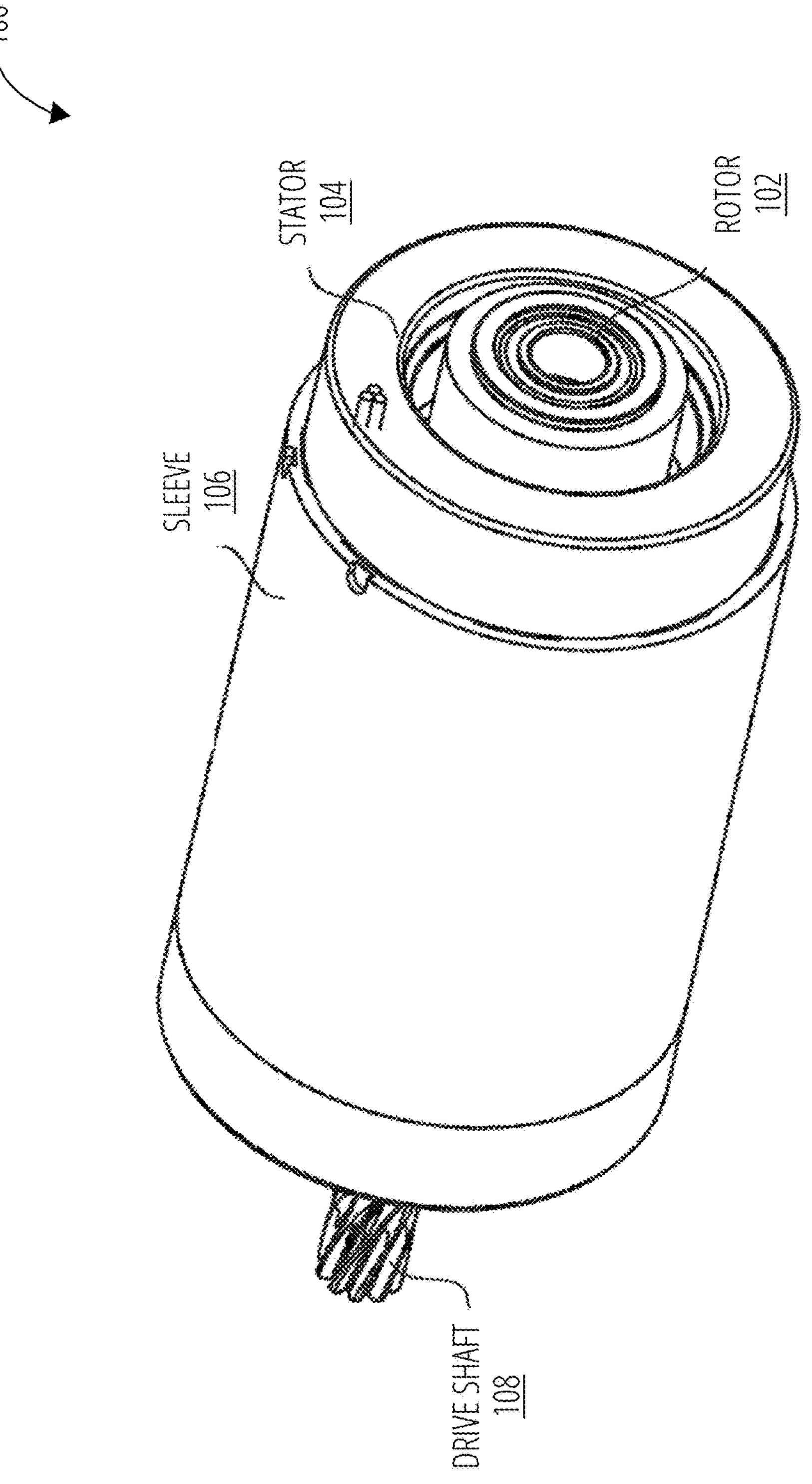
FIG. 1 illustrates an example of a direct current motor.

The drawings are not necessarily to scale. The drawings are merely representations, not intended to portray specific parameters of the disclosure. The drawings are intended to depict exemplary implementations of the current subject matter, and therefore, are not to be considered as limiting in scope. In the drawings, like numbering represents like elements.

Further, certain elements in some of the figures may be omitted, and/or illustrated not-to-scale, for illustrative clarity. Cross-sectional views may be in the form of "slices", and/or "near-sighted" cross-sectional views, omitting certain background lines otherwise visible in a "true" cross-sectional view, for illustrative clarity. Additionally, for clarity, some reference numbers may be omitted in certain drawings.

DETAILED DESCRIPTION

Various approaches in accordance with the present disclosure will now be described more fully hereinafter with reference to the accompanying drawings, where implementations of a system and method are shown. The devices, system(s), component(s), etc., may be embodied in many different forms and are not to be construed as being limited to the example implementations set forth herein. Instead, these example implementations are provided so this disclosure will be thorough and complete, and will fully convey the scope of the current subject matter to those skilled in the art.

To address these and potentially other deficiencies of currently available solutions, one or more implementations of the current subject matter relate to methods, systems, articles of manufacture, and the like that can, among other possible advantages, provide a magnetic compensation circuit for use in various direct current (DC) motors, including brushless DC motors.

In some implementations, the current subject matter relates to a motor assembly, e.g., a brushless direct current (DC) assembly. The assembly may include one or more magnets positioned about a rotor, a stator enclosing the one or more magnets, a first and a second magnetic sensors positioned in at least one of the stator and the rotor, and a ferromagnetic enclosure enclosing at least a portion of the stator (e.g., positioned adjacent to the stator). At least one of the magnetic sensors may be linear Hall sensors. The enclosure may be configured to compensate a magnetic field detected by at least one of the magnetic sensors. The enclosure may be partially circular, partially polygonal, fully circular, fully polygonal, and/or any other type of enclosure, and/or any combination of enclosures.

The enclosure may include an inner surface, an outer surface, and a body disposed between the inner and outer surfaces. The body may include a first portion having a first predetermined thickness and a second portion having a second predetermined thickness. The first portion may have a first radial distance defined by a first arc angle value and the second portion may have a second radial distance defined by a second arc angle value. The first predetermined thickness may be defined by a first difference between an outer radius, defining a distance between a radial center of the body and the outer surface, and a first inner radius, defining a distance between the radial center of the body and the inner surface of the first portion. The second predetermined thickness may be defined by a second difference between the outer radius and a second inner radius, defining a distance between the radial center of the body and the inner surface of the second portion. The first inner radius may be less than the second inner radius, and thus, the first predetermined thickness may be greater than the second predetermined thickness. In some implementations, the body may have a predetermined magnetic permeability, e.g., greater than one. As can be understood, any value of magnetic permeability may be used.

In some implementations, one or more notches may be made in the outer surface of the body of the enclosure. For example, a first notch may be positioned in the first portion of the body, and a second notch may be positioned in the second portion of the body. A position of the first notch may be configured to be aligned with a position of one of the magnetic sensors, and a position of the second notch may be configured to aligned with a position of another one of the magnetic sensors.

A brushless direct current motor, or a brushless motor includes a rotor having at least one permanent magnet, and a stator having a plurality of coils or windings that generate a magnetic field. The motor uses an electronic controller to switch DC currents to the windings that rotate in space and which the rotor's permanent magnet follows. The controller can adjust phase and/or amplitude of the current pulses that control the speed and torque of the motor. A brushless motor converts electric energy into magnetic energy and then into a mechanical rotation movement. Some brushless motors are configured with the rotor positioned around the stator. This configuration allows high motor torque to be obtained with a relatively low rotation frequency. Other brushless motor configurations, including mirror, rotor-in-stator, etc. are used as well.

In the motor, the stator forms a circular based hollow cylinder with a central volume that receives the rotor (which can also be in the form of a solid, circular based cylinder). The rotor includes a shaft for driving an external component. In some cases, the motor can include radial partitions that extend between a central volume and an outer wall of the stator. The partitions together define unitary volumes or notches, which are open toward the rotor. The notches surround the rotor when the rotor is introduced into the central volume of the stator.

FIG. 1 illustrates an example of a brushless DC motor 100. The motor 100 can include one or more components (e.g., active components) that can be manufactured from various metals, metallic materials, composites, etc. Other components of the motor (e.g., outer covering, etc.) can be manufactured from composite materials, polymers, etc. The DC motor 100 can be used in various technical fields, such as, for example, but not limited to aeronautical, space, medical, automotive, marine, agricultural, and/or any other industry that implements use of movable (e.g., rotationally, translationally, etc.) component(s).

The motor 100 can include a rotor 102, a stator 104, a sleeve 106, and a drive shaft 108. The rotor 102 can be positioned within the stator 104, which, in turn, at least in part, can be enclosed by the sleeve 106. The sleeve 106 can define an outer wall of the DC motor 100. The drive shaft 108 can be directly fixed on one end of the rotor 102 and can extend the rotor 102.

Figure 2:
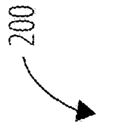
FIG. 2 illustrates an example of a direct current motor using linear Hall sensors.
Figure 2:
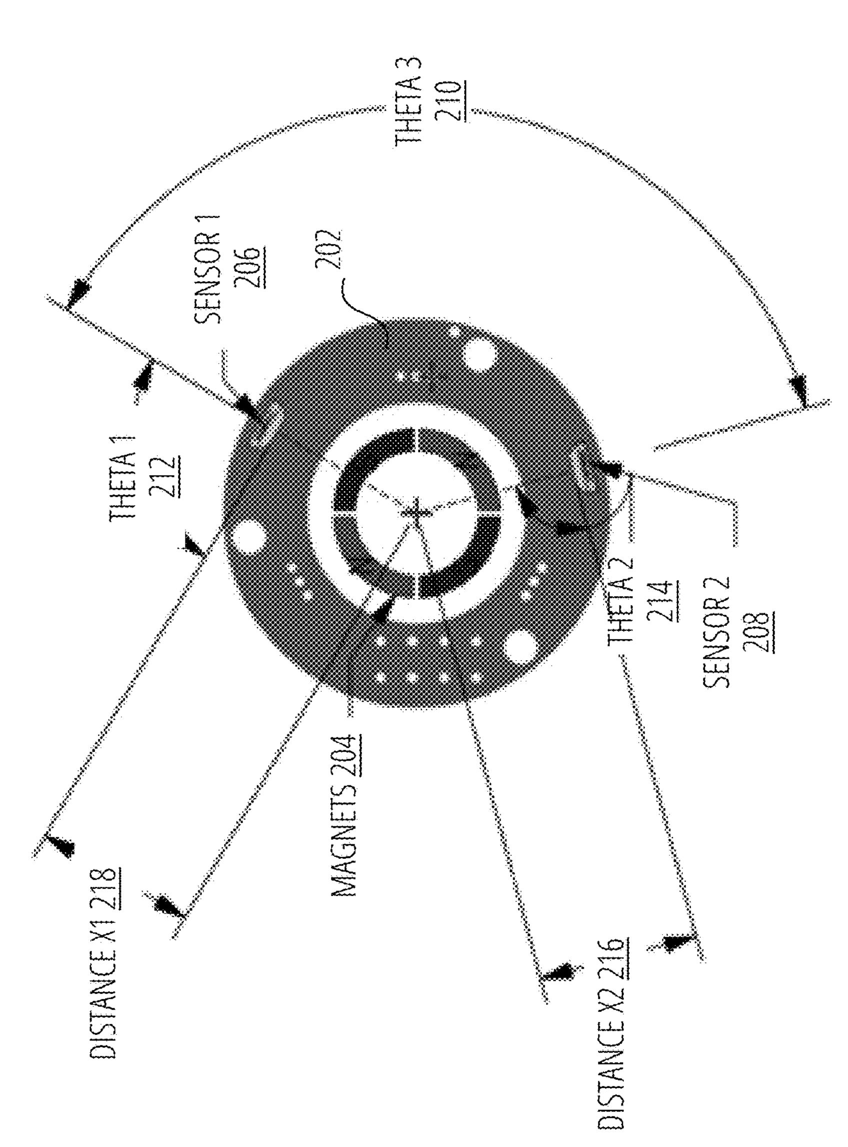

The rotor 102 can include one or more permanent magnets (e.g., at least two permanent magnets) positioned on an outer face of the rotor 102 (as shown in FIG. 2). The magnets can, for example, be glued on the outer face, with a glue bridge being provided between two neighboring magnets. The magnets can extend over the entire length of the rotor 102 and can be disposed so that the north and south poles of two neighboring magnets are alternately oriented toward the outside and toward the inside of the rotor 102. As can be understood, any number of permanent magnets can be used.

The rotor 102 can be hollow, solid, etc. The magnets, under the effect of the magnetic field generated by the stator 104 can cause rotation of the rotor 102 and, thus, cause rotation of the drive shaft 108.

Some brushless DC motor designs use Hall effect sensors and/or rotary encoder(s) to determine the rotor's position during operation of the motor. Hall sensors can be called linear if their output is proportional to the incident magnetic field strength. In motor operation, linear Hall sensors convert magnetic field of rotating permanent magnet(s) shaft to electrical signals, where amplitude of electrical signal(s) is proportional to the magnetic field strength of the permanent magnet(s) at a corresponding distance. The signal(s) measured from linear Hall sensors (e.g., two sensors) with electrically 90 degrees phase shift (corresponding to a sine (SIN) and a cosine (COS), respectively) is used in brushless DC motors to enable angle measurement (e.g., as a tangent (TAN) corresponding to SIN divided by COS).

FIG. 2 an example of a direct current motor system 200 that uses one or more linear Hall sensors. The system 200 can be incorporated into the DC motor 100 shown in FIG. 1. For the purposes of illustration only, FIG. 2 shows a cross-sectional view of the motor system 200 and includes only portions that are relevant to the discussion presented herein. The system 200 can include a printed circuit board (PCB) 202, one or more magnets 204 that are enclosed by the PCB 202, and one or more sensors (e.g., sensor 1 206 and sensor 2 208) embedded into and/or positioned on the PCB 202. The magnets 204 can include alternating four north-south magnets (e.g., two north and two south). The magnets 204 may be positioned on the rotor (e.g., rotor 102 shown in FIG. 1).

The sensors 206, 208 can be linear Hall sensors. Each sensor's position can be characterized by its distance from the center of the rotor, its radial position in the stator, and radial distance from the other sensor. For example, the position of the sensor 1 206 can be defined by distance X1 218, which corresponds to the distance of the sensor 1 206 from the center of the rotor. Moreover, sensor 1 206's radial position on the PCB 202 can be defined by the angle theta 1 212, as shown in FIG. 2, corresponding to the SIN value of angular position of one or more permanent magnets of the rotor during rotation. Similarly, the position of the sensor 2 208 can be defined by distance x2 216, which corresponds to the distance of the sensor 2 208 to the center of the rotor. Its radial position on the PCB 202 can be defined by the angle theta 2 214, corresponding to the COS value of angular position of one or more permanent magnets of the rotor during rotation. Additionally, the sensors 206, 208 can be separated by the angle theta 3 210 corresponding to a radial distance between the sensors.

The signal of each Hall sensor has certain level of inaccuracy due to various tolerances and/or factors. For example, these can include one or more mechanical tolerances, e.g., an absolute position (distance X1 218, distance x2 216, and/or theta 3 210) and/or orientation of sensor(s) (e.g., theta 1 212 and/or theta 2 214). These can also include electrical factors, e.g., tolerances of electrical interface circuit elements. Additionally, these can include magnetics factors, e.g., respective magnetic field strength(s) of rotor's permanent magnets. Further, tolerance of sensor(s) 206, 208 to corresponding magnetic field(s) (e.g., normally (+/−3%)) may also affect reading accuracies of sensors. In some cases, peak and/or valley amplitudes of each SIN and COS signal values, as measured by each Hall sensor 206, 208 can introduce certain levels of inaccuracy in angle measurement(s) due to imbalances between peak(s) and/or valley(s) of each sensor, respectively.

Figure 3:
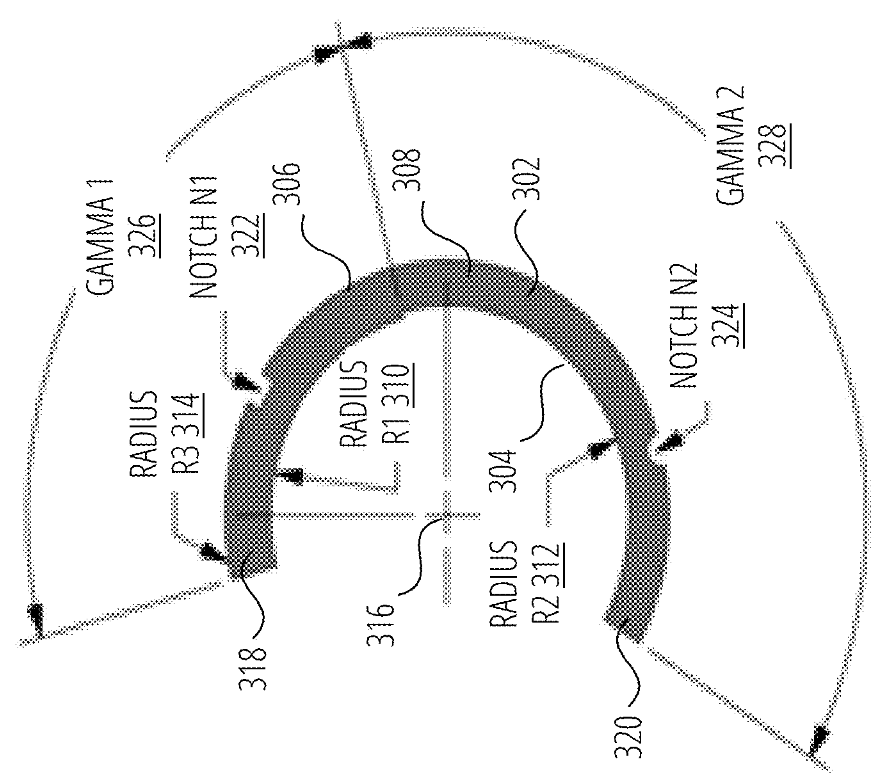
FIG. 3 illustrates an example of a ferromagnetic compensation ring, according to some implementations of the current subject matter.

FIG. 3 illustrates an example of a ferromagnetic compensation ring or enclosure 302, according to some implementations of the current subject matter. The ferromagnetic compensation ring 302 may include an inner surface 304, an outer surface 306, and a body 308 disposed between the inner surface 304 and the outer surface 306. The body 308 may include a first portion 318 and a second portion 320. The first portion 318 may have a first predetermined thickness and the second portion 320 may have a second predetermined thickness. The thicknesses of the first and second portions 318, 320 may be different and/or the same.

The first portion 318 may be defined by radius R1 310, radius R3 314, and a radial distance or arc gamma 1 326. The radius R1 310 may be defined as a distance from a radial center 316 of the ring 302 to the inner surface 304 of the first portion 318. The radius R3 314 may be defined as a distance from the radial center 316 to the outer surface 306. The thickness of the first portion 318 may be equal to a difference between radius R3 314 and radius R1 310.

Similarly, the second portion 320 of the body 308 may be defined by radius R2 312, radius R3 314, and a radial distance or arc gamma 2 328. The radius R2 312 may be defined as a distance from the radial center 316 to the inner surface 304 of the second portion 320. The thickness of the second portion 320 may be equal to the difference between radius R3 314 and radius R2 312.

The portions 318 and 320 may be adjacent to one another and may be formed as part of the unitary body 308. Alternatively, or in addition, the portions 318 and 320 may be separate from one another and may be coupled to each other to form the body 308.

In some implementations, the radius R1 310 may be smaller and/or less than the radius R2 312. The radius R3 314 of the outer surface 306 may be uniform throughout the entire body 308. Because radius R1 310 is smaller than the radius R2 312, the thickness of the first portion 318 may be greater than the thickness of the second portion 320. As can be understood, the thickness of the first portion 318 may be smaller than the thickness of the second portion 320 (i.e., radius R1 310 is greater than radius R2 312). Alternatively, or in addition, the thicknesses of both portions 318, 320 may be the same (i.e., radius R1 310 equals to radius R2 312). Further, thicknesses of each portions 318, 320 may be uniform throughout each respective portion, or non-uniform.

The radial distance gamma 1 326 may define a length of the outer surface 306 of the first portion 318 that correlates with a length of the inner surface 304 of the first portion 318 defined by the radius R1 310. Similarly, the radial distance gamma 2 328 may define a length of the outer surface 306 of the second portion 320 that correlates with a length of the inner surface 304 of the second portion 320 defined by the radius R2 312. The radial distances gamma 1 326 and gamma 2 328 may be the same or different from one another. As can be understood, any of the radius R1 310, radius R2 312, radius R3 314, gamma 1 326, gamma 2 328 and/or any other characteristics of the ferromagnetic compensation ring 302 may be specifically selected for a particular application and/or use of the ferromagnetic compensation ring 302.

Figure 4:
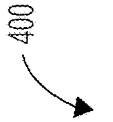
FIG. 4 illustrates an example motor assembly using a ferromagnetic compensation ring, according to some implementations of the current subject matter.
Figure 4:
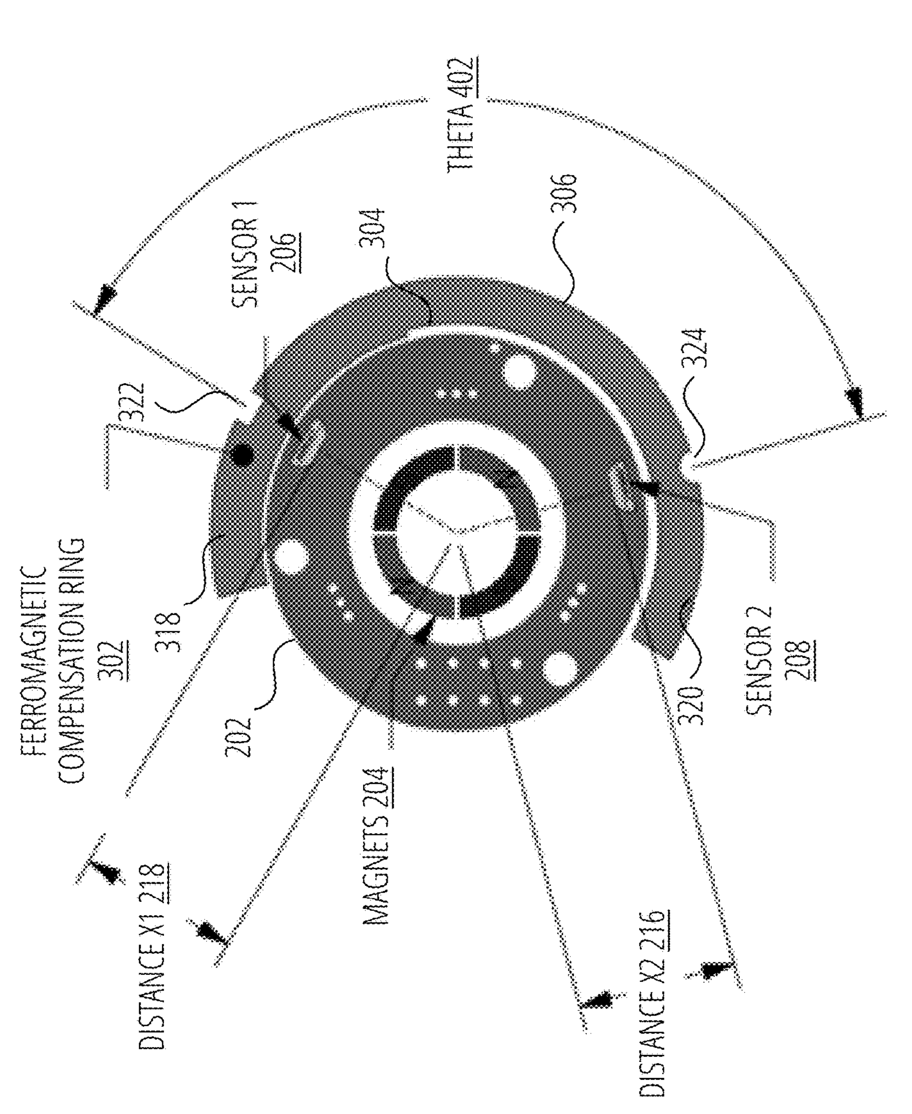

In some implementations, the first portion 318 may include a first notch N1 322 that may be defined in the outer surface 306 of the first portion. The second portion 320 may include a second notch N2 324 that may be defined in the outer surface 306. As shown in FIG. 4, a position of the first notch N1 322 may be configured to be aligned with a position of a first magnetic sensor (e.g., linear Hall sensor 1 206) of a motor (not shown in FIG. 3). A position of the second notch N2 324 may be configured to aligned with a position of a second magnetic sensor (e.g., linear Hall sensor 2 208) of the motor. The notches may have any desired shape and/or depth (in the body 308). For example, as shown in FIG. 3, the notch N1 322 may have a generally rectangular shape, whereas the notch N2 324 may have a generally circular shape. Different shapes may be helpful in visually distinguishing between the two notches. As can be understood, the notches may have any desired shapes, depths, sizes, etc., which may be same or different for each notch. Use of the notches 322, 324 as well as the different thickness portions 318, 320 may allow the ferromagnetic enclosure to compensate amplitude(s), peak(s) and valley(s) of magnetic field(s) that may be detected by the magnetic sensors.

In some implementations, the body 308 of the ferromagnetic compensation ring 302 may be configured as a full ring, a partial ring or as a ferromagnetic sheet material ring (e.g., as shown in FIG. 3). Moreover, the ring 302 may have a circular geometry (as shown in FIG. 3), a polygonal geometry, and/or any other type of geometry. The body 308 of the ring 302 may further be defined by a predetermined magnetic permeability, the value of which may be dependent on a particular use of the ring 302. By way of a non-limiting example, the permeability of the ring 302 may be greater than one. As can be understood, any other magnetic permeability values may be used. The body 308 may have an overall symmetrical geometry.

FIG. 4 illustrates an example motor assembly 400 that uses the ferromagnetic compensation ring 302, according to some implementations of the current subject matter. The assembly 400 may can be incorporated into a motor, such as, for example, the DC motor 100 shown in FIG. 1. For the purposes of illustration only, FIG. 4 shows a cross-sectional view of the motor system 400 and includes only portions that are relevant to the discussion presented herein.

The system 400 may include the PCB 202, one or more magnets 204 enclosed by the PCB 202, sensor 1 206, sensor 2 208 embedded into and/or otherwise positioned on the PCB 202, and the ferromagnetic compensation ring 302 positioned adjacent the PCB 202. Similar to FIG. 2, the system 400 may include four magnets 204 may include four alternating north-south magnets (e.g., two north and two south) that may be positioned on the rotor (e.g., rotor 102 shown in FIG. 1). As discussed above, the ferromagnetic compensation ring 302 may have any desired shape, form, etc. For example, the ring 302 may be partially circular (e.g., as shown in FIG. 4), partially polygonal, fully circular (e.g., positioned around the entirety of the stator), fully polygonal, and/or have any other shape.

The ferromagnetic compensation ring 302, and in particular, its respective notches 322, 324 may be aligned with the sensors 206, 208, respectively. The sensors 206, 208 may be linear Hall sensors. As shown in FIG. 2, sensors' positions may be defined by a distance of each sensor from the center of the rotor, its radial position in the stator, and radial distance from the other sensor. As discussed herein with respect to FIG. 2, the position of the sensor 1 206 may be defined by the distance X1 218 corresponding to the distance of the sensor 1 206 from the center of the rotor and angle theta 1 212 corresponding to the sine value of angular position of one or more permanent magnets 204 of the rotor during rotation. The position of the sensor 2 208 may be defined by the distance x2 216 corresponding to the distance of the sensor 2 208 to the center of the rotor and angle theta 2 214 corresponding to the cosine value of angular position of one or more permanent magnets 204 of the rotor during rotation. Further, when the ferromagnetic compensation ring 302 is positioned adjacent the PCB 202, the notch N1 322 may be configured to be aligned with the sensor 1 206 and the notch N2 324 may be configured to be aligned with the sensor 2 208. Further, the first portion 318 may be positioned proximate to the sensor 1 206 and the second portion 320 may be positioned proximate to the sensor 2 208. Additionally, the sensors 206, 208 and the notches 322, 324 may be separated by a radial distance or an arc theta 402.

In some implementations, the positions of the notches 322, 324 in the assembly 400 in relation to the respective sensors 206, 208 may be selectable based on desired operational characteristics of the motor and/or each sensor 206, 208. For example, measured sensor responses (e.g., peak(s) and valley(s)) of may be used to determine how the ferromagnetic compensation ring 302 should be positioned around the PCB 202. If, for instance, response values (sine) of the linear Hall sensor 1 206, have smaller peak(s) than that of the corresponding peak(s) in response values (cosine) of the linear Hall sensor 2 208, then the second portion 320 of the ferromagnetic compensation ring 302 may be placed next to the sensor 1 206. Alternatively, or in addition, if, for instance, response values (sine) of the linear Hall sensor 1 206 have larger valley(s) than response values (cosine) of the corresponding peak(s) of linear Hall sensor 2 208, then the second portion 320 of the ferromagnetic compensation ring 302 may be positioned adjacent to the sensor 2 208.

In some implementations, a motor may be used with one or more ferromagnetic rings 302 that have different radius R1 310 and/or radius R2 312. Use of differently sized rings 302 may allow for calibration to enable accurate tunning of the peak(s) and valley(s) of response curves of linear Hall sensors 206, 208, respectively.

In some implementations, the current subject matter may have one or more of the following benefits. For example, the assembly 400, and in particular, its ferromagnetic compensation ring 302, reduces inaccuracies in the readings of the Hall sensor(s) signal(s), improves accuracy of operation of the Hall sensor(s), increases positioning tolerance of the sensor(s) (e.g., use of the ring 302 may be configured to enable positioning of the sensors 206, 208 in any desired locations), reduces components error in the electrical voltage divider and filter circuits connected to the sensor(s). Moreover, the current subject matter overcomes higher costs and calibration times that are typically associated the existing solutions, while improving outcome by providing sensor signal reading accuracy higher than 3%, electrical resistor with error higher than 1%, and position tolerance greater than +/−0.002 inches. Further, the current subject matter's magnetic compensation circuit assembly may compensate and tune all the inaccuracies that may exist in the sensor(s) signal(s) without increasing accuracy of the sensor(s), or increasing the accuracy of circuit elements coupled thereto or defining a fine tolerance in the sensor(s) position(s). The ferromagnetic compensation ring 302 may allow lean balancing of peak(s) and valley(s) of the sensor(s) that make corresponding sine and cosine signals in a post calibration process without changing the physical element of existing sensor(s), such as, for example, circuit elements, positions, and/or permanent magnets.

The components and features of the devices described above may be implemented using any combination of discrete circuitry, application specific integrated circuits (ASICs), logic gates and/or single chip architectures. Further, the features of the devices may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It will be appreciated that the exemplary devices shown in the block diagrams described above may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

Some implementations and/or embodiments may be described using the expression "one embodiment" or "an embodiment" or "one implementation" or "an implementation" along with their derivatives. These terms mean that a particular feature, structure, or characteristic described in connection with the embodiment is included in at least one embodiment. The appearances of the phrase "in one embodiment", "in some implementations" (or derivatives thereof) in various places in the specification are not necessarily all referring to the same embodiment. Moreover, unless otherwise noted the features described above are recognized to be usable together in any combination. Thus, any features discussed separately may be employed in combination with each other unless it is noted that the features are incompatible with each other.

It is emphasized that the abstract of the disclosure is provided to allow a reader to quickly ascertain the nature of the technical disclosure. It is submitted with the understanding that it will not be used to interpret or limit the scope or meaning of the claims. In addition, in the foregoing detailed description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the detailed description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects. Further, the use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

In one aspect, a ferromagnetic compensation apparatus may include a ferromagnetic enclosure having an inner surface; an outer surface; a body disposed between the inner surface and the outer surface, wherein the body includes a first portion having a first predetermined thickness and a second portion having a second predetermined thickness; a first notch in the outer surface, the first notch is positioned in the first portion of the body; and a second notch in the outer surface, the second notch is positioned in the second portion of the body; wherein a position of the first notch is configured to be aligned with a position of a first magnetic sensor of a motor, and a position of the second notch is configured to aligned with a position of a second magnetic sensor of the motor; wherein the ferromagnetic enclosure is configured to compensate a magnetic field detected by at least one of the first magnetic sensor and the second magnetic sensor.

The apparatus may also include wherein the ferromagnetic enclosure is at least one of: a partially circular ferromagnetic enclosure, a partially polygonal ferromagnetic enclosure, a fully circular ferromagnetic enclosure, a fully polygonal ferromagnetic enclosure, and any combination thereof.

The apparatus may also include wherein the first portion has a first radial distance defined by a first arc angle value and the second portion has a second radial distance defined by a second arc angle value.

The apparatus may also include wherein the first predetermined thickness of the first portion is defined by a first difference between an outer radius and a first inner radius, wherein the outer radius defining a distance between a radial center of the body and the outer surface, and the first inner radius defining a distance between the radial center of the body and the inner surface of the first portion; the second predetermined thickness of the second portion is defined by a second difference between the outer radius and a second inner radius, wherein the second inner radius defining a distance between the radial center of the body and the inner surface of the second portion.

The apparatus may also include wherein the first inner radius is less than the second inner radius, and the first predetermined thickness is greater than the second predetermined thickness.

The apparatus may also include wherein the body has a predetermined magnetic permeability.

The apparatus may also include wherein the predetermined magnetic permeability is greater than one.

The apparatus may also include wherein at least one of the first and second magnetic sensors is a linear Hall sensor.

The apparatus may also include wherein the motor is a brushless direct current motor.

The apparatus may also include wherein the ferromagnetic enclosure is configured to be positioned adjacent to a stator of the motor.

In one aspect, a motor assembly may include one or more magnets positioned about a rotor; a stator enclosing the one or more magnets; a first and a second magnetic sensors positioned in at least one of the stator and the rotor; and a ferromagnetic enclosure enclosing at least a portion of the stator and having an inner surface; an outer surface; a body disposed between the inner surface and the outer surface, wherein the body includes a first portion having a first predetermined thickness and a second portion having a second predetermined thickness; a first notch in the outer surface, the first notch is positioned in the first portion of the body; and a second notch in the outer surface, the second notch is positioned in the second portion of the body; wherein a position of the first notch is configured to be aligned with a position of the first magnetic sensor, and a position of the second notch is configured to aligned with a position of the second magnetic sensor; wherein the ferromagnetic enclosure is configured to compensate a magnetic field detected by at least one of the first magnetic sensor and the second magnetic sensor.

The motor assembly may also include wherein the ferromagnetic enclosure is at least one of: a partially circular ferromagnetic enclosure, a partially polygonal ferromagnetic enclosure, a fully circular ferromagnetic enclosure, a fully polygonal ferromagnetic enclosure, and any combination thereof.

The motor assembly may also include wherein the first portion has a first radial distance defined by a first arc angle value and the second portion has a second radial distance defined by a second arc angle value.

The motor assembly may also include wherein the first predetermined thickness of the first portion is defined by a first difference between an outer radius and a first inner radius, wherein the outer radius defining a distance between a radial center of the body and the outer surface, and the first inner radius defining a distance between the radial center of the body and the inner surface of the first portion; the second predetermined thickness of the second portion is defined by a second difference between the outer radius and a second inner radius, wherein the second inner radius defining a distance between the radial center of the body and the inner surface of the second portion.

The motor assembly may also include wherein the first inner radius is less than the second inner radius, and the first predetermined thickness is greater than the second predetermined thickness.

The motor assembly may also include wherein the body has a predetermined magnetic permeability.

The motor assembly may also include wherein the predetermined magnetic permeability is greater than one.

The motor assembly may also include wherein at least one of the first and second magnetic sensors is a linear Hall sensor.

The motor assembly may also include wherein the motor assembly is a brushless direct current motor.

The motor assembly may also include wherein the ferromagnetic enclosure is configured to be positioned adjacent to the stator.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner and may generally include any set of one or more limitations as variously disclosed or otherwise demonstrated herein.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Further, identification references (e.g., primary, secondary, first, second, third, fourth, etc.) are not intended to connote importance or priority but are used to distinguish one feature from another. The drawings are for purposes of illustration only and the dimensions, positions, order and relative sizes reflected in the drawings attached hereto may vary.

The present disclosure is not to be limited in scope by the specific implementations described herein. Indeed, other various implementations of and modifications to the present disclosure, in addition to those described herein, will be apparent to those of ordinary skill in the art from the foregoing description and accompanying drawings. Thus, such other implementations and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A ferromagnetic compensation apparatus, comprising:

a ferromagnetic enclosure having an inner surface;

an outer surface;

a body disposed between the inner surface and the outer surface, wherein the body includes a first portion having a first predetermined thickness and a second portion having a second predetermined thickness, wherein the first portion has a first radial distance defined by a first arc angle value and the second portion has a second radial distance defined by a second arc angle value;

a first notch in the outer surface, the first notch is positioned in the first portion of the body; and a second notch in the outer surface, the second notch is positioned in the second portion of the body;

wherein a position of the first notch is configured to be aligned with a position of a first magnetic sensor of a motor, and a position of the second notch is configured to aligned with a position of a second magnetic sensor of the motor;

wherein the ferromagnetic enclosure is configured to compensate a magnetic field detected by at least one of the first magnetic sensor and the second magnetic sensor.

2. The apparatus of claim 1, wherein the ferromagnetic enclosure is at least one of: a partially circular ferromagnetic enclosure, a partially polygonal ferromagnetic enclosure, a fully circular ferromagnetic enclosure, a fully polygonal ferromagnetic enclosure, and any combination thereof.

3. The apparatus of claim 1, wherein the first predetermined thickness of the first portion is defined by a first difference between an outer radius and a first inner radius, wherein the outer radius defining a distance between a radial center of the body and the outer surface, and the first inner radius defining a distance between the radial center of the body and the inner surface of the first portion;

the second predetermined thickness of the second portion is defined by a second difference between the outer radius and a second inner radius, wherein the second inner radius defining a distance between the radial center of the body and the inner surface of the second portion.

4. The apparatus of claim 3, wherein the first inner radius is less than the second inner radius, and the first predetermined thickness is greater than the second predetermined thickness.

5. The apparatus of claim 1, wherein the body has a predetermined magnetic permeability.

6. The apparatus of claim 5, wherein the predetermined magnetic permeability is greater than one.

7. The apparatus of claim 1, wherein at least one of the first and second magnetic sensors is a linear Hall sensor.

8. The apparatus of claim 7, wherein the motor is a brushless direct current motor.

9. The apparatus of claim 1, wherein the ferromagnetic enclosure is configured to be positioned adjacent to a stator of the motor.

10. A motor assembly, comprising:

one or more magnets positioned about a rotor;

a stator enclosing the one or more magnets;

a first and a second magnetic sensors positioned in at least one of the stator and the rotor;

a ferromagnetic enclosure enclosing at least a portion of the stator and having an inner surface;

an outer surface;

a body disposed between the inner surface and the outer surface, wherein the body includes a first portion having a first predetermined thickness and a second portion having a second predetermined thickness;

a first notch in the outer surface, the first notch is positioned in the first portion of the body; and a second notch in the outer surface, the second notch is positioned in the second portion of the body;

wherein a position of the first notch is configured to be aligned with a position of the first magnetic sensor, and a position of the second notch is configured to aligned with a position of the second magnetic sensor;

wherein the ferromagnetic enclosure is configured to compensate a magnetic field detected by at least one of the first magnetic sensor and the second magnetic sensor.

11. The motor assembly of claim 10, wherein the ferromagnetic enclosure is at least one of: a partially circular ferromagnetic enclosure, a partially polygonal ferromagnetic enclosure, a fully circular ferromagnetic enclosure, a fully polygonal ferromagnetic enclosure, and any combination thereof.

12. The motor assembly of claim 10, wherein the first portion has a first radial distance defined by a first arc angle value and the second portion has a second radial distance defined by a second arc angle value.

13. The motor assembly of claim 10, wherein the first predetermined thickness of the first portion is defined by a first difference between an outer radius and a first inner radius, wherein the outer radius defining a distance between a radial center of the body and the outer surface, and the first inner radius defining a distance between the radial center of the body and the inner surface of the first portion;

the second predetermined thickness of the second portion is defined by a second difference between the outer radius and a second inner radius, wherein the second inner radius defining a distance between the radial center of the body and the inner surface of the second portion.

14. The motor assembly of claim 13, wherein the first inner radius is less than the second inner radius, and the first predetermined thickness is greater than the second predetermined thickness.

15. The motor assembly of claim 10, wherein the body has a predetermined magnetic permeability.

16. The motor assembly of claim 15, wherein the predetermined magnetic permeability is greater than one.

17. The motor assembly of claim 10, wherein at least one of the first and second magnetic sensors is a linear Hall sensor.

18. The motor assembly of claim 17, wherein the motor assembly is a brushless direct current motor.

19. The motor assembly of claim 10, wherein the ferromagnetic enclosure is configured to be positioned adjacent to the stator.

* * * * *